(12) United States Patent
Venkitachalam et al.

(10) Patent No.: US 8,765,541 B1
(45) Date of Patent: Jul. 1, 2014

(54) INTEGRATED CIRCUIT AND A METHOD TO OPTIMIZE STRAIN INDUCING COMPOSITES

(75) Inventors: Girish Venkitachalam, San Jose, CA (US); Che Ta Hsu, San Jose, CA (US); Fangyun Richter, San Jose, CA (US); Peter J. McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 144 days.

(21) Appl. No.: 13/214,056

(22) Filed: Aug. 19, 2011

(51) Int. Cl.
*H01L 21/8238* (2006.01)

(52) U.S. Cl.
USPC .................................... 438/199; 257/E21.409

(58) Field of Classification Search
USPC ......................... 438/197, 199, 183, 129, 301; 257/E21.409
See application file for complete search history.

(56) References Cited

U.S. PATENT DOCUMENTS

2009/0166676 A1\* 7/2009 Lee et al. ........................ 257/192
2010/0269075 A1\* 10/2010 Tonti et al. ........................ 716/4

\* cited by examiner

*Primary Examiner* — Whitney T Moore
(74) *Attorney, Agent, or Firm* — Womble Carlyle Sandridge & Rice LLP

(57) ABSTRACT

A method to design an IC is disclosed to provide a uniform deposition of strain-inducing composites is disclosed. The method to design the IC comprises, determining a total strain-inducing deposition area on an IC design. Then, the total strain inducing deposition area is compared with a predefined size. A dummy diffusion area is modified to increase the total strain-inducing deposition area, when the total strain-inducing deposition area is below the predefined size. Finally, the strain-inducing deposition area is optimized. A method to manufacture the IC and the IC is also disclosed.

17 Claims, 7 Drawing Sheets

US 8,765,541 B1

INTEGRATED CIRCUIT AND A METHOD TO OPTIMIZE STRAIN INDUCING COMPOSITES

BACKGROUND

Strain engineering is utilized to evaluate the strain within the transistor channel in order to optimize the semiconductor device performance. Strain modulation either enhances electron or hole mobility within the transistor channel and thereby enhances conductivity of the transistor channel.

Strain engineering applications in Complementary Metal Oxide Semiconductor (CMOS) transistors varies depending upon whether the implementation is on a Positive channel Metal Oxide Semiconductor (PMOS) transistor or a Negative channel Metal Oxide Semiconductor (NMOS) transistor. The PMOS and NMOS transistors respond differently to different forms of strain. The conductivity of a PMOS channel improves when applied with compressive strain upon the channel, whereas the conductivity of a NMOS channel improves when applied with tensile strain upon the channel. Conversely, the conductivity of PMOS channel worsens when applied with tensile strain upon the channel, whereas the conductivity of NMOS channel worsens when applied with compressive strain upon the channel.

Strain engineering techniques have become an important factor to achieve optimum performance of the semiconductor devices. Strain engineering techniques impact numerous parameters, including speed and leakage of electrical current across the transistor channel.

An example of the continuous advances in semiconductor process is the decrease of feature size, e.g., the decrease of transistor channel width, within the semiconductor process. Hence, small variations in semiconductor processes that previously had insignificant impacts on large features, now contribute a significant impact, e.g., increase of leakage under a gate of the transistor. Furthermore, higher performance devices require tighter process control and variations.

A problem that occasionally happens in strain engineering is an imbalance of strain-inducing composites. The imbalance occurs due to a micro-loading effect, in which concentrations of the strain-inducing composites to be deposited varies significantly between different regions during the growth process. Such an imbalance of growth between regions results in varied performance of the transistors of the different regions.

It is within this context that the embodiments described herein arise.

SUMMARY

Embodiments of invention provide an integrated circuit (IC) and a method to manufacture the IC. It should be appreciated that the present embodiment can be implemented in numerous ways, such as a process, an apparatus, a system, a device, or a method. Several inventive embodiments are described below.

In one embodiment, a method to design an IC is described. The method includes determining a total strain-inducing deposition area on an IC design. The total strain-inducing deposition area is a predefined area having a specified size in one embodiment. The predefined area may be about 10%-15% of the total IC design area, in one embodiment. The dummy diffusion area is modified in order to increase the total strain-inducing deposition area, provided that the deposition area is below the predefined size. Next the optimization of the strain-inducing deposition area on the dummy diffusion is performed. The optimization includes removing a portion of the strain-inducing deposition area from the dummy diffusion area or adding a dummy polysilicone onto the dummy diffusion area.

In another embodiment, a method to manufacture the IC is described. The method includes forming a transistor on the device region of the substrate. A dummy diffusion region is formed within a non-device area of the substrate. The strain-inducing material is grown adjacent to the transistor and within the dummy diffusion region to distribute the strain-inducing material uniformly. The strain-inducing material may be either Silicon Germanium (SiGe) or Silicon Carbide (SiC), depending on the type of transistor in one embodiment. The strain-inducing material is grown utilizing an epitaxial process in one embodiment.

In another embodiment, a structure that is formed within an IC is described. The structure includes a substrate that has functional devices, e.g., a transistor. The structure includes a dummy diffusion region that is either a p-type or a n-type. The structure also includes a strain-inducing composite placed on top of the dummy diffusion region and partly embedded within the dummy diffusion region. The structure may also include a dummy polysilicone placed directly above the dummy diffusion region thereby displacing a portion of the strain-inducing composite.

Other aspects will become apparent from the following detailed description, taken in conjunction with the accompanying drawings, illustrating by way of example.

BRIEF DESCRIPTION OF THE DRAWINGS

The embodiments may be understood by reference to the following description taken in conjunction with the accompanying drawings.

DETAILED DESCRIPTION

The following embodiments describe an IC and a method to manufacture the IC. It will be obvious, however, to one skilled in the art, that the present embodiments may be practiced without some or all of these specific details. In other instances, well-known operations have not been described in detail in order not to unnecessarily obscure the present embodiments.

The embodiments described below illustrate a method to design an IC. The method to design an IC provides a uniform strain-inducing composite across the transistor in order to have a consistent speed and leakage of current across the transistor. The method includes increasing the overall area of the strain-inducing composite and then optimizing the design area to overcome a micro-loading effect. The embodiments also describe a method to manufacture an IC and the structure of the IC that is derived using the IC design.

Figure 1:
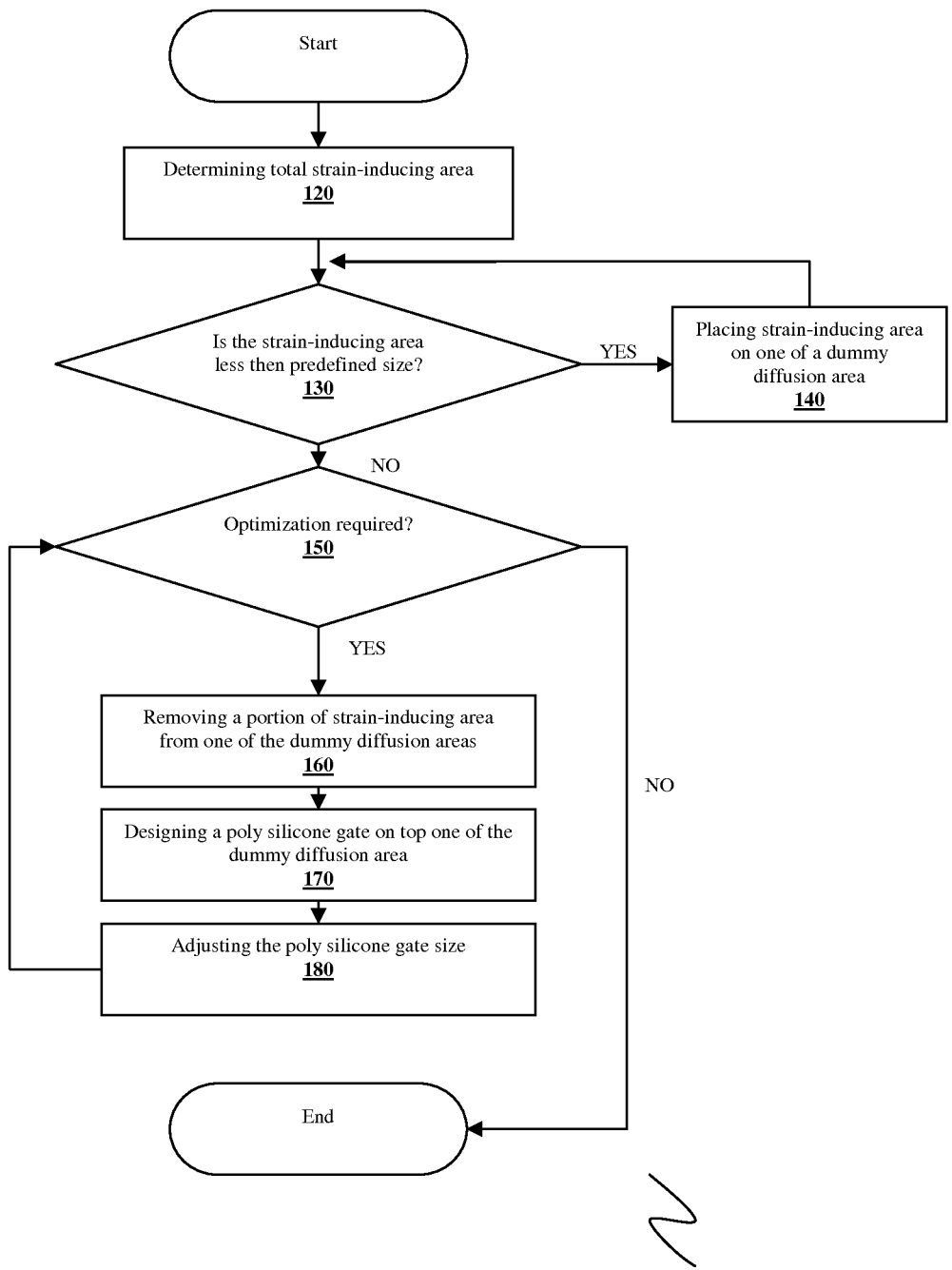
FIG. 1, meant to be illustrative and not limiting, illustrates a flowchart for a method to design an integrated circuit (IC) in accordance with one embodiment.

FIG. 1, meant to be illustrative and not limiting, illustrates a flowchart for a method to design an IC. The flowchart 100 includes determining the total strain-inducing area within the IC design in operation 120. The IC design is translated to be laid over a substrate during manufacturing of the IC. The total area, determined from the total area for the strain-inducing area, is compared with a predefined size as in operation 130. The predefined size represents a size of an area needed in the IC design to avoid the micro-loading effect during the IC manufacturing. If the strain-inducing area is less then the predefined size, additional strain-inducing area is introduced within the IC design, as in operation 140. A person skilled in the art appreciates that the determination of "less than predefined size" as in operation 130 should not be strictly limited to a particular number. Typically within the semiconductor industry, this threshold should be a range of limits to overcome other potential semiconductor and reliability problems. The additional strain-inducing area is placed over a dummy diffusion area within the IC design. The dummy diffusion area is a non-active diffusion area that is present in the IC design. After operation 140, the total strain-inducing area in the IC design is increased. The comparison of the total strain-inducing area with the predefined size is repeated as in operation 130. If the total strain-inducing area is still less than the predefined size, the strain-inducing area placement is carried out on another dummy diffusion area as in operation 140. The cycle of operations 130 and 140 repeats until the total strain-inducing area is greater or equal than the predefined size. Once the total strain-inducing area is greater or equal than the predefined size, the method advances to operation 150 where optimization for the strain-inducing area is determined. In one embodiment, the optimization determination depends on the placement of the strain-inducing area within the IC design. In another embodiment, the optimization depends on whether the placement of the strain inducing area is symmetrical to an axis running across the functional area, i.e., PMOS or NMOS of the IC design, as described further below. If the IC design is symmetrical, the optimization of the additional strain-inducing area is not required, whereas if the IC design is not symmetrical, the optimization of the additional strain-inducing area is performed. If the optimization is not required, then the IC design is considered completed as in operation 190. If the optimization steps are required, then the optimization steps are carried out.

Still referring to FIG. 1, the optimization, if required, includes removing a portion of the strain-inducing area from one of the dummy diffusion areas as in operation 160. The "removal of a portion of the strain inducing area" in operation 160 refers to generating a design such as design 227c or 228c as illustrated in FIG. 2C. A person skilled in the art appreciates that the amount of strain-inducing area that is removed depends on the extent of optimization requirement. Next, the optimization can be carried out by designing a dummy polysilicone above the dummy diffusion area as in operation 170. The dummy polysilicone is placed within the same layer as the strain-inducing area in one embodiment. It should be appreciated that the portion of area where the polysilicone is placed does not have the strain-inducing area, as the strain inducing area was removed in operation 160. Thus, that portion of strain-inducing area within the dummy diffusion area is replaced by the dummy polysilicone. After the location of dummy polysilicone placement is fixed, the dummy polysilicone size can be adjusted as in operation 180. The adjustment can be carried out with regards to the width and height of the dummy polysilicone. Once the size adjustment of dummy polysilicone is completed, the method determines if further optimization is required as in operation 150. The conditions whether further optimization is required is dependent upon whether the strain-inducing area is placed symmetrically in one embodiment. If further optimization is required, operations 160, 170 and 180 are repeated until an optimized IC design is obtained. Thereafter, the method to design the IC terminates as in operation 190.

The above mentioned method determines the area by utilizing logic operations (LOP). Through LOP the total design area is obtained. The LOP is a foundry process that also adds the dummy diffusion area, the strain-inducing composite area onto the transistors and other design-for-manufacturing (DFM) onto the layout of the IC design in one embodiment. Further detail on the method to obtain the design area is not described in detail in order not to obscure the invention. The strain-inducing area within this embodiment refers to an area that is deposited, grown, or diffused with the strain-inducing composites during the manufacturing process. In one embodiment, the strain-inducing composite is a compressive strain-inducing composite, e.g., Silicon Germanium (SiGe). The compressive strain-inducing composite induces compression forces to the substrate underneath the strain-inducing composite. In another embodiment, the strain-inducing material is a tensile strain-inducing composite, e.g., Silicon Carbide (SiC). The tensile strain-inducing composite induces tensile forces to the substrate underneath the strain-inducing composite. The strain-inducing composite enhances the performance of the IC depending upon the selected strain-inducing composites. A PMOS transistor typically has the compressive strain-inducing composite directly above the source and drain regions of the PMOS transistor. An NMOS transistor typically has the tensile strain-inducing composite placed directly above the source and drain regions of the NMOS transistor. The selected strain-inducing composite is placed directly above the transistor regions, i.e. source and/or drain, in order to enhance the electrical current speed (Idsat) and the electrical current leakage (Ileak) of the respective transistor.

The predefined size, herein, is possible to be determined through a series of experimental evaluations. In one embodiment, the experimental evaluation determines the predefined size to be large enough for obtaining a uniform growth of the strain-inducing composite across the substrate. The uniformity on the strain-inducing composite is determined by the layer thickness of the strain-inducing composite in one embodiment. In another embodiment, the experimental evaluation determines the predefined area to be large enough, which results in having a consistent and equivalent Idsat across a plurality of transistors. The Idsat consistency is measured through the performance level in one embodiment. The consistency of Idsat is a measurement of uniform growth of the strain-inducing composites among the plurality of transistors. In another embodiment, an experimental evaluation is conducted to determine the predefined size to be large enough for obtaining uniform consumption of the substrate, wherein the strain-inducing composite is grown from within the substrate. A person skilled in the art appreciates that the predefined size can also be gathered by utilizing other experimental evaluations and/or simulation methods. In one embodiment, the predefined size is approximately 10%-15% of the total IC design area. In another embodiment, the predefined size is approximately 10%-15% from an identified region within the IC design area, where the identified region is a region within a close proximity to the transistor.

Dummy diffusion area refers to a diffusion region, typically made either from a Negative Well (N-Well) or a Positive well (P-Well), where the dummy diffusion area is not utilized for a transistor. The dummy diffusion areas are located on areas where there are no active regions. In the semiconductor process, a dummy diffusion area is added into the IC design for the purpose of DFM.

The optimization techniques as described herein are developed to fulfill the requirements of semiconductor manufacturing design rules. As such, the governing design rules the placement of dummy polysilicone. In one embodiment, the design rule limitation disallows unfilled portions of the strain-inducing area that is removed above the dummy diffusion area for the purpose of optimization. This limitation introduces another design rule that is to place the dummy polysilicone within the unfilled portions of the strain inducing area. In another embodiment, the design rule limitation restricts the amount of the portion of strain-inducing area that can be removed. Such a restriction confines the fine tuning capabilities of the design method, i.e., removal of a small portion of the strain-deposition area may be disallowed. Under such an event, the removal is performed through the insertion of the dummy polysilicone. The reasons for such design rules are not elaborated further as these reasons are not necessary to appreciate the embodiments described herein.

Figure 2A:
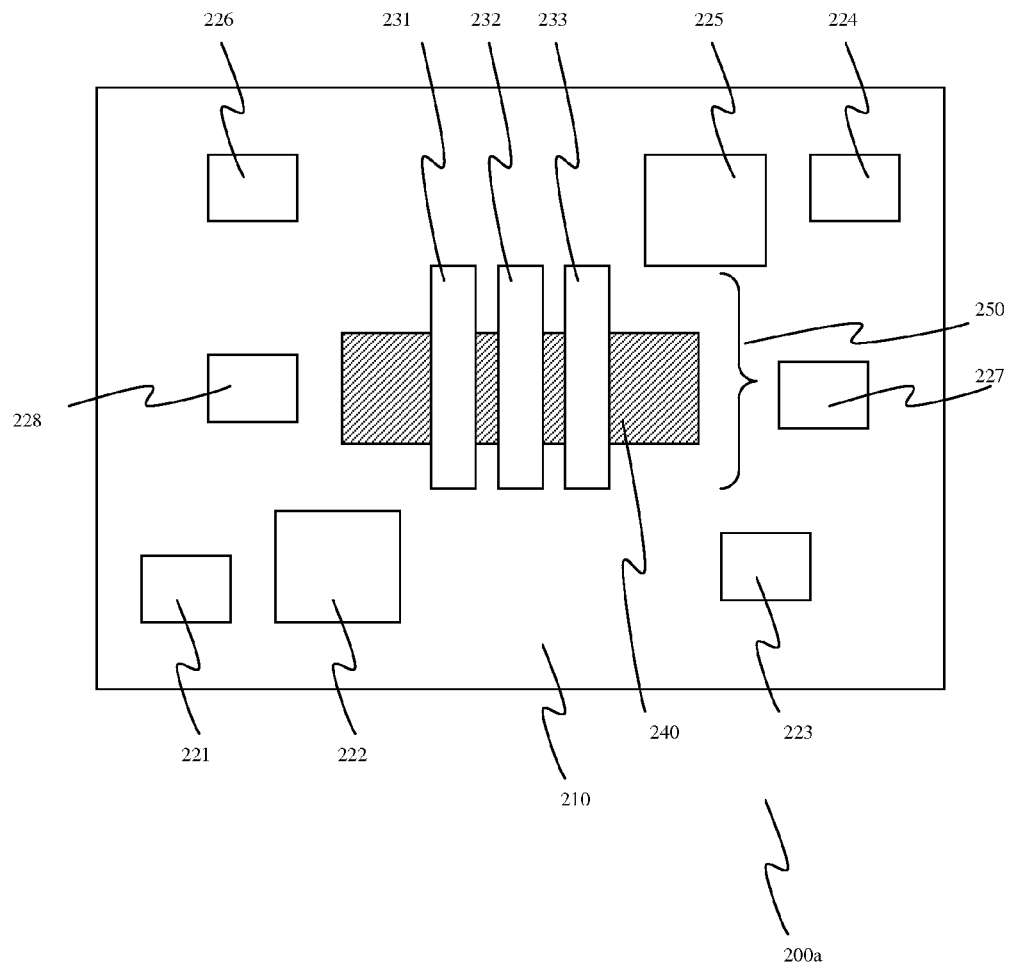
FIG. 2A-2C, meant to be illustrative and not limiting, illustrates preliminary, intermediate and final layout of an IC design in accordance with one embodiment.

FIG. 2A, meant to be illustrative and not limiting, illustrates a preliminary layout stage of an IC design undergoing the design method described herein. IC 200a is in the preliminary design stage, which is an initial stage of the design method illustrated in FIG. 1. The IC 200a includes a transistor 250 and a plurality of dummy diffusion areas 221-228 on a substrate 210. In one embodiment, the substrate 210 is composed of a semiconductor material, e.g., Silicone (Si) or Gallium Arsenide (GaAs). The substrate 210 is either doped with an n-type dopant or a p-type dopant. The transistor 250 is a CMOS transistor, in one embodiment, which may be either an NMOS transistor or a PMOS transistor. The transistor 250 includes a plurality of gates 231-233 and an active area 240. The plurality of gates 231-233 may, in effect, form a multi-finger transistor. The active area 240 is a diffusion area, wherein the diffusion area is either an N-well or a P-well, based on the type of the transistor 250. If the transistor 250 is NMOS, then the active area 240 is a P-well and if transistor 250 is PMOS, then the active area 240 is an N-well. The active area 240 also includes a layer of strain-inducing area confined within the boundaries of the active area 240 and placed above a surface of the substrate 210. The strain-inducing area as described in FIG. 1 may includes either SiGe or SiC composites. The purpose of the strain-inducing area is to increase the Idsat performance. A person skilled in the art will appreciate that the transistor 250, as illustrated in FIG. 2A, is a simplified illustration without the detailed interconnections to other circuitries. The plurality the dummy diffusion areas 221-228 are placed surrounding the transistor 250. The positioning and sizing of the dummy diffusion areas 221-228 are handled through the DFM, and will not be elaborated further in order not to obscure the invention.

Still referring to FIG. 2A and sequentially following the method of FIG. 1, the size of the active region 240 is determined for the purpose of determining the total size of the strain-inducing area. If the size of the active region is below the predefined area, one of the dummy diffusion areas 221-228 will add-on a layer of strain-inducing area to increase the total strain-inducing area. The process of adding-on continues for the remaining dummy diffusion areas 221-228 until the total strain-inducing area is greater than or equal to the predefined area. In one embodiment, the selection sequence to add-on the strain-inducing area is random. In another embodiment, the selection sequence is restricted to a symmetrical formation across an axis dividing the transistor 250.

Figure 2B:
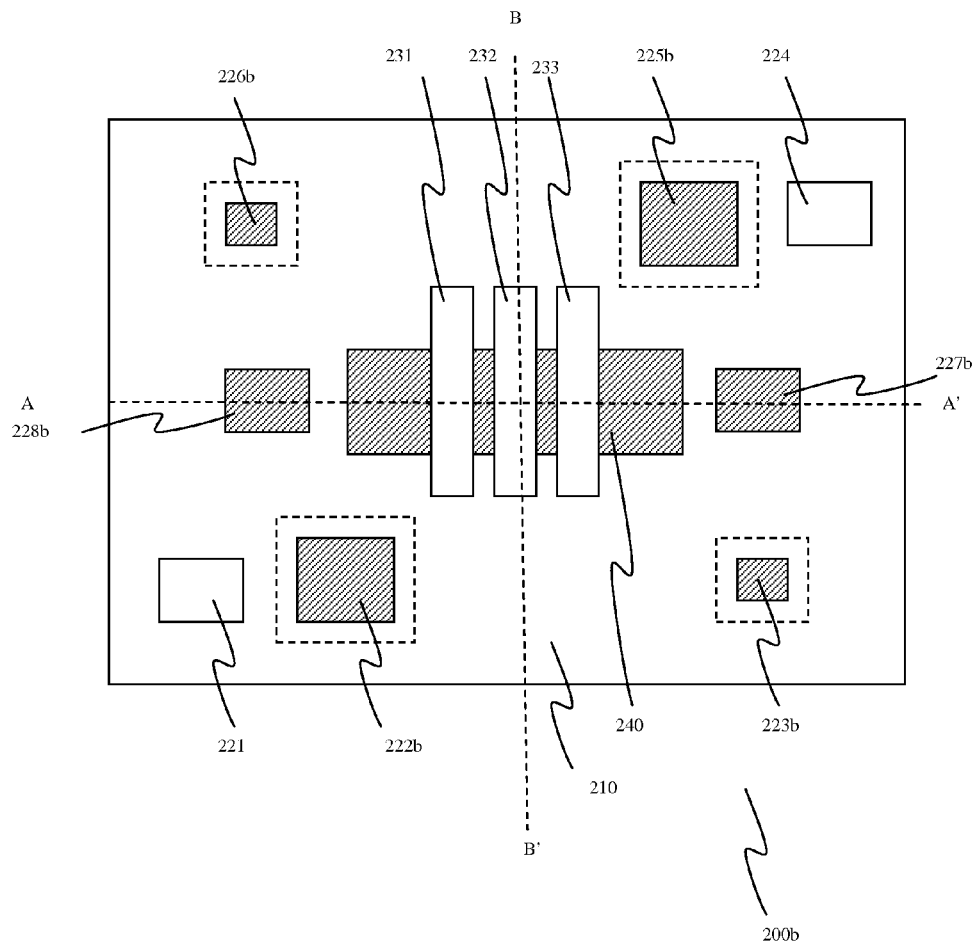
Figure 2C:
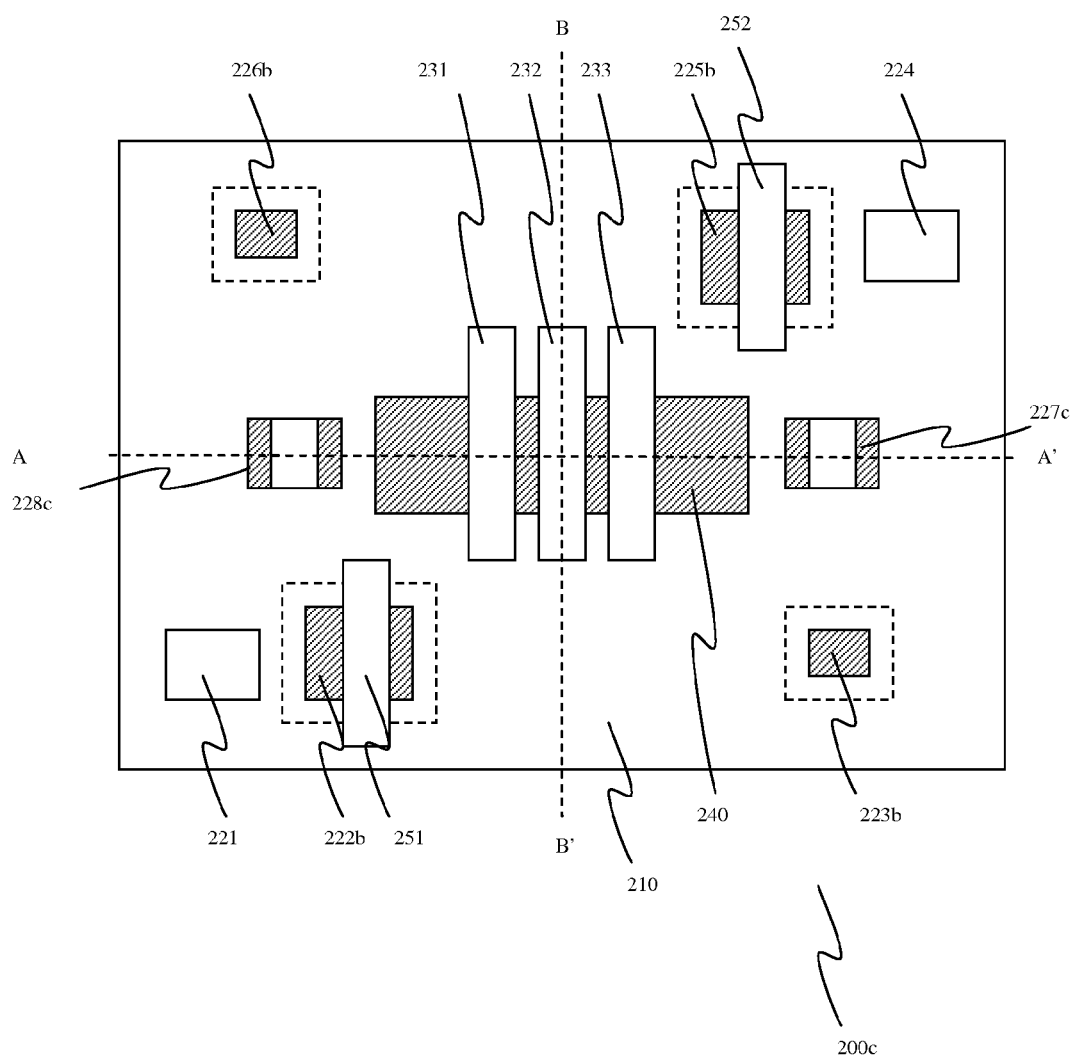

FIG. 2B, meant to be illustrative and not limiting, illustrates an intermediate stage of the IC design undergoing the design method. The IC 200b is in the intermediate design stage. The transistor 250 and the dummy diffusion areas 221-228 are in the same position as illustrated in FIG. 2A. During the intermediate design stage, the strain-inducing area is placed above a surface of the selected dummy diffusion area and within the boundaries defined by the selected dummy diffusion area. The layout design includes modified dummy diffusion areas 222b, 223b, 225b, 226b, 227b and 228b. The modified dummy diffusion area includes a layer of strain-inducing area placed directly above each of the dummy diffusions area. According to the design method flow as illustrated in FIG. 1, the next operation is to determine whether optimization of the layout design is required. As illustrated in FIG. 2B quadrants confined between A-B line and A'-B' line have equivalent total strain-inducing area as the quadrants confined between A-B' line and A'-B line. In one embodiment where the symmetrical criteria of the strain-inducing area is not satisfied, as set forth under the design method, optimization is required. According to the method of FIG. 1, the optimization is performed by (i) removing a portion of strain-inducing area from the added-on strain-inducing material or (ii) adding-in a dummy polysilicone on top of the dummy diffusion area, wherein such addition displaces the strain-inducing area that overlaps with the dummy polysilicone. A person skilled in the art appreciates that the addition of the dummy polysilicone provides a better resolution in terms of removing a portion of the strain-inducing area as compared to just the removal of the portion of strain-inducing area. The method then moves on to determine whether if further optimization is required. If required, the optimization is performed on another modified dummy diffusion area.

FIG. 2C, meant to be illustrative and not limiting, illustrates the final stages of the layout IC design undergoing the design method. The IC 200c is in the final design stage. The transistor and dummy diffusion areas 221-228 are in the same location as in FIG. 2A. The final design, which is after the optimization, includes a dummy polysilicone 251 placed within the modified dummy diffusion area 222b and a dummy polysilicon 252 placed within the modified dummy diffusion 225b. The final design also includes optimized modified dummy diffusion areas 227c and 228c that have a portion of the strain-inducing area removed. Based on the four quadrants defined in between the A-B' line and A'-B line, the strain-inducing areas are equally divided and hence satisfy the symmetrical criteria. It should be appreciated that the size of dummy polysilicone 251 and 252 is controlled during the design optimization.

Figure 3:
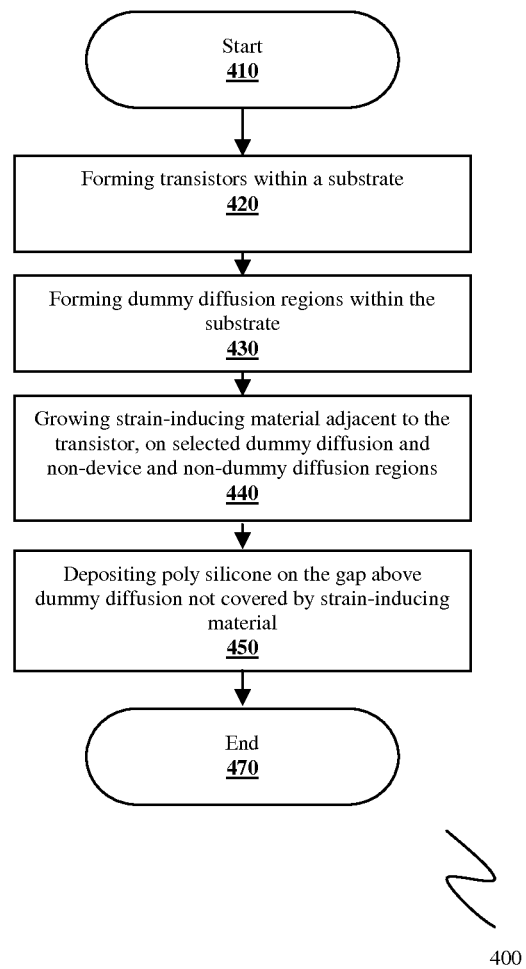
FIG. 3, meant to be illustrative and not limiting, illustrates a method to manufacture an IC in accordance with one embodiment.

FIG. 3, meant to be illustrative and not limiting, illustrates a method to manufacture an IC. The method 400 includes forming a transistor within a substrate as in operation 420. In one embodiment, the substrate is a semiconductor material, e.g. Silicon (Si), Gallium Arsenide (GaAs), etc. The transistor may be either a NMOS or PMOS transistor. A person skilled in the art appreciates the process of forming a transistor includes formation of a source, drain and gate. Next, dummy diffusion regions are formed within the substrate as in operation 430. The dummy diffusion region is an embedded well within the substrate composed either an n-type or p-type dopants. The dummy diffusion regions are spaced apart from the NMOS or PMOS transistor to avoid hindrance to the active diffusion regions, such as the diffusion regions forming the source and drain of the transistor. In one embodiment, the dummy diffusion region that surrounds the PMOS transistor and spaced apart from the transistor is a p-type well. In another embodiment, the dummy diffusion region that surrounds the NMOS transistor and spaced apart from the transistor is an n-type well. A person skilled in the art appreciates that the functionality of the dummy diffusion regions are for the DFM. Further details on dummy diffusion regions are not described in order not to obscure the invention.

Figure 4A:
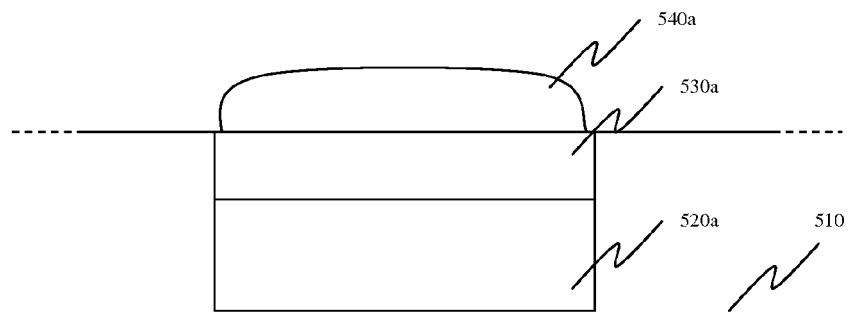
FIG. 4A-4D, meant to be illustrative and not limiting, illustrate a cross section of a manufactured IC in accordance with one embodiment.

Still referring to FIG. 3, the strain-inducing material may be grown on three different regions; (1) above the source and drain of the transistor, (2) above of the selected dummy diffusion regions and/or (3) on non-device non-dummy diffusion regions as in operation 440. The strain-inducing material may be grown, epitaxially, on top of the source or drain of the transistor to enhance the speed of the transistor in one embodiment. The strain-inducing material may be grown on the selected dummy diffusion region based on selection criterion that is determined by the criteria as set forth in operation 130 in FIG. 1. The strain-inducing material may also be grown on the non-device non-dummy diffusion regions. In one embodiment, the strain-inducing material is the SiGe composite that is grown (1) on top of the source and drain of the PMOS transistors (2) on top of the p-type well dummy diffusion regions as illustrated in FIG. 4A and (3) on the non-device non-dummy diffusion regions surrounding the PMOS transistor as illustrated in FIG. 4C. The selection of regions, the dummy diffusion region and the non-device non-dummy diffusion region, to grow the strain-inducing composite may be to obtain the predefined size. The purpose to obtain the predefined size is to attain a uniformly distributed strain-inducing composite across the substrate, especially across the active diffusion regions of the transistor. The strain-inducing material is grown through utilizing a combination of photoresist, photolithography and epitaxial growth processes in one embodiment. The epitaxial growth forms a crystal structure that is identical to the crystal orientation within the substrate. Next, polysilicone is deposited onto the gap as in operation 450. The gap arises due to design optimization as in operations 150 and 160 of FIG. 1. A person skilled in the art appreciates that the deposition process can be performed utilizing plating, especially electroplating, process or a chemical vapor deposition (CVD) process.

FIG. 4A, meant to be illustrative and not limiting, illustrates a cross section view of an IC that is manufactured based on the design upon modified dummy diffusion areas 223b or 226b of FIG. 2C. The IC 500a is manufactured using the method illustrated in FIG. 3. The IC 500a includes a substrate 510, a dummy diffusion region 520a, an embedded strain-inducing composite 530a and a strain-inducing composite 540a. The substrate 510 herein is composed of a semiconductor composite, i.e., Si or GaAs. The embedded strain-inducing composite 530a and the strain-inducing composite 540a are grown utilizing the epitaxial process in one embodiment. The epitaxial growth herein refers to the growth of the strain inducing composite 540a and the embedded strain-inducing composite 530a to have identical crystal orientation to the substrate. The embedded strain-inducing composite 530a and the strain-inducing composite 540a typically have identical compositions within a structure of the IC. In one embodiment, the dummy diffusion region 520a is an n-type well, and the strain-inducing composites 530a and 540a are tensile-inducing composites. The n-type well includes silicone doped with phosphorous (P). The tensile-inducing composite includes SiC as mentioned above.

In another embodiment, the dummy diffusion region 520a is a p-type well, and the strain-inducing composites 530a and 540a are a compressive-inducing composite. The p-type well includes silicone doped with Boron (B) or Aluminum (Al) in one embodiment. The compressive-inducing composite includes SiGe composite. One of the differences between the embedded strain-inducing composites 530a and the strain-inducing composites 540a is in doping density, i.e. the doping density of Phosphorous, Boron or Aluminum. In one embodiment, the doping density is higher in concentration within the strain-inducing element 540a.

Figure 4B:
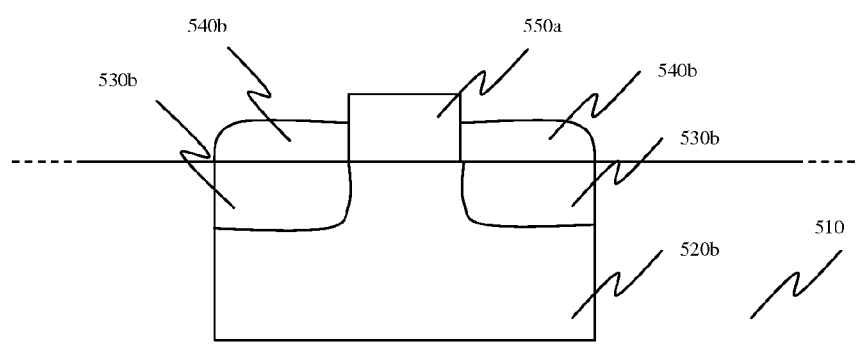
Figure 4C:
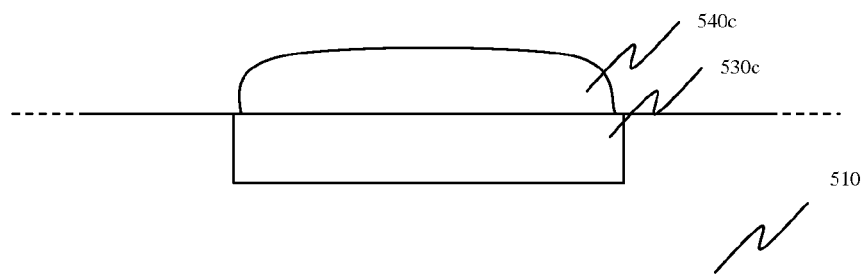

FIG. 4B, meant to be illustrative and not limiting, illustrates a cross sectional view of an IC that is manufactured based on the design of the modified dummy diffusion areas 222b or 225b, given the modified dummy diffusion areas 222b and 225b, as illustrated in FIG. 2C. The IC 500b is manufactured using the method illustrated in FIG. 3. IC 500a of FIG. 5A and 500b of FIG. 5B are similar except for the differences that will be discussed below. A dummy polysilicone 550a is placed above the dummy diffusion region 520b and encompasses portions the dummy diffusion region 520b. In one embodiment, the dummy polysilicone 550a disposed over a mid-section of the dummy diffusion region 520b. The embedded strain-inducing composite 530b is grown within the dummy diffusion region 520b but not below the region that is covered by the dummy polysilicon 550a. The strain-inducing composite 540b is grown in areas where dummy polysilicone 550a is not present, but still within the dummy diffusion region 520b.

FIG. 4C, meant to be illustrative and not limiting, and illustrates a cross sectional view of an IC that is manufactured with the strain-inducing composite on unutilized regions based on operation 440 in FIG. 3. The IC 500c differs from the IC structure 500a within FIG. 4A by absence of the dummy diffusion region 520a underneath the embedded strain-inducing composite 530c. The IC 500c is created when the semiconductor manufacturing LOP does not add a sufficient number of dummy diffusion regions.

Figure 4D:
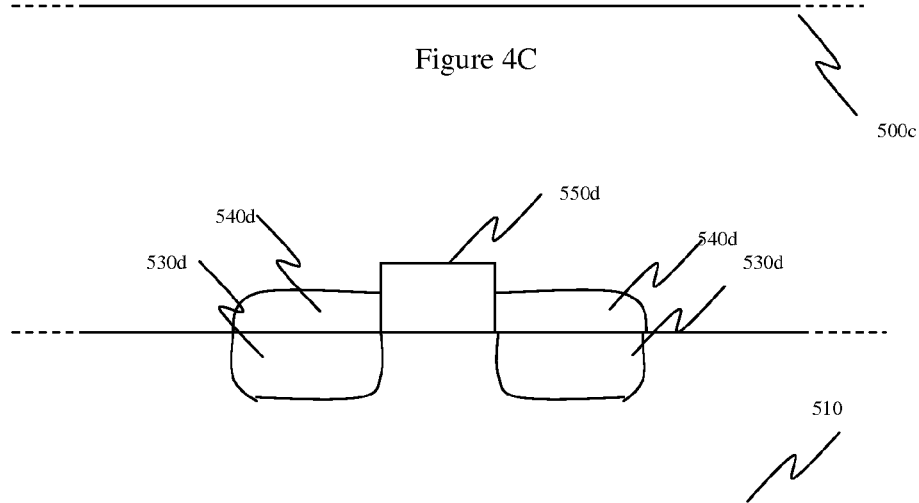

FIG. 4D, meant to be illustrative and not limiting, illustrates a cross section view of an IC manufactured basing the design upon a portion of the strain-inducing composite on an unutilized region together with polysilicone. The IC 500d differs from the IC structure 500b within FIG. 4B by having a dummy polysilicone 550d above the substrate 510. The IC structure 500d also differs by the absence of the strain-inducing composite 540d on the regions wherever there is the dummy polysilicone 550d. A person skilled in the art appreciates that the strain-inducing composite region is not present below the dummy polysilicon 550d regions within the substrate 510.

A person skilled in the art appreciates the reason for unevenness on each layer as illustrated by the cross sectional views of the IC 500a-500d are due to semiconductor processes. The dummy polysilicone 550a and 550d, herein, is not connected to any other circuitry within the IC in one embodiment. Typically the dummy polysilicone 550a and 550d is also known as a dummy gate. The IC structures 500b and 500d are created to optimize the design in order to obtain uniform growth of the strain-inducing composites across the quadrants created by A-B' line and A'-B line as shown in FIG. 2A-2C.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to design an integrated circuit (IC), comprising:
    determining a strain-inducing deposition area on an IC design;
    comparing the strain-inducing deposition area with a predefined area, wherein the predefined area is large enough to reduce effects of small variations of a manufacturing process of a strain-deposition composite;
    modifying a dummy diffusion area to increase the strain-inducing deposition area when the strain-inducing deposition area is less than the predefined area; and
    optimizing the strain-inducing deposition area on the dummy diffusion area, wherein at least one method operation is executed through a processor.

2. The method in claim 1, wherein the predefined area is within about 5% to 15% of a total IC design area.

3. The method in claim 1, wherein the strain-inducing deposition area is one of a Silicon Germanium (SiGe) deposition area or a Silicon Carbide (SiC) deposition area.

4. The method in claim 1, wherein the modifying comprises placing a strain-inducing deposition area above the dummy diffusion area.

5. The method in claim 4, wherein the optimizing comprises removing a portion of the strain-inducing deposition area from the dummy diffusion area.

6. The method in claim 5, wherein the optimizing further comprises designing a dummy polysilicon gate on the dummy diffusion area.

7. The method in claim 6, wherein the optimizing further comprises adjusting a size of the dummy polysilicon gate, wherein the strain-inducing deposition area decreases as the size of the dummy polysilicon gate increases.

8. A method to manufacture an integrated circuit (IC), comprising:
    forming a transistor on a device region of a substrate;
    forming a dummy diffusion region on a non-device area of the substrate;
    disposing a strain-inducing material adjacent to the transistor; and
    disposing the strain-inducing material on the dummy diffusion region to distribute the strain-inducing material substantially uniformly across the substrate, wherein a total area of the strain-inducing material distributed across the substrate is within a predefined size range that is large enough to reduce effects of small variations of a manufacturing process of a strain-deposition composite.

9. The method in claim 8, wherein the strain-inducing material is one of Silicon Germanium (SiGe) composite or Silicon Carbide (SiC) composite.

10. The method in claim 8, wherein the strain-inducing deposition is disposed through an epitaxial process.

11. The method in claim 8 further comprises:
    forming a dummy polysilicon gate over the dummy diffusion region.

12. The method in claim 11, wherein a portion of the strain-inducing material is disposed wherever the dummy polysilicon gate is formed.

13. The method in claim 8 further comprising:
    growing the strain-inducing material on a portion of a non-device non-dummy diffusion region.

14. A method to design an integrated circuit (IC), comprising:
    placing a strain-inducing deposition area onto one of a plurality of dummy areas within an IC design, wherein the placing continues for other dummy diffusion areas until a total area of the strain-inducing deposition area reaches a predefined size, wherein the predefined size is large enough to reduce effects of small variations of a manufacturing process of a strain-deposition composite; and
    optimizing each strain-inducing deposition area for uniformity, wherein at least one method operation is executed through a processor.

15. The method in claim 14, wherein the strain-inducing deposition area is one of a compression-inducing composite or a tensile-inducing composite.

16. The method in claim 14, wherein the optimizing comprises:
    designing a polysilicon gate within the strain-inducing deposition area; and
    adjusting the polysilicon gate size to optimize the strain-inducing deposition area.

17. The method in claim 14, further comprising designing the strain-inducing deposition area within a non-utilized area.

* * * * *